(12) United States Patent
Umemoto et al.

(10) Patent No.: US 11,011,612 B2
(45) Date of Patent: May 18, 2021

(54) SEMICONDUCTOR DEVICE

(71) Applicant: ROHM CO., LTD., Kyoto (JP)

(72) Inventors: Kiyotaka Umemoto, Kyoto (JP); Keisuke Tsutsumi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/453,500

(22) Filed: Jun. 26, 2019

(65) Prior Publication Data
US 2020/0027957 A1  Jan. 23, 2020

(30) Foreign Application Priority Data

Jul. 20, 2018 (JP) .............................. JP2018-136498

(51) Int. Cl.
*H01L 29/49* (2006.01)
*H02M 3/156* (2006.01)
*H01L 29/78* (2006.01)
*H02M 1/00* (2006.01)

(52) U.S. Cl.
CPC ............ *H01L 29/49* (2013.01); *H01L 29/783* (2013.01); *H02M 3/156* (2013.01); *H02M 2001/0003* (2013.01)

(58) Field of Classification Search
CPC ... H01L 29/49; H01L 29/783; H01L 29/7802; H01L 2224/48135; H01L 29/78; H02M 3/156; H02M 2001/0003; H02M 1/08
See application file for complete search history.

(56) References Cited

U.S. PATENT DOCUMENTS

| 2014/0087520 A1* | 3/2014 | Funatsu | H01L 24/83 438/112 |
| 2015/0014687 A1* | 1/2015 | Nakajima | H03K 17/567 257/48 |
| 2015/0035129 A1* | 2/2015 | Zhang | H01L 24/27 257/675 |
| 2017/0062386 A1* | 3/2017 | Wang | H01L 24/49 |

FOREIGN PATENT DOCUMENTS

JP    2004-342735    12/2004

* cited by examiner

*Primary Examiner* — Su C Kim
(74) *Attorney, Agent, or Firm* — Hamre, Schumann, Mueller & Larson, P.C.

(57) ABSTRACT

A semiconductor device, includes: a first semiconductor chip including a first semiconductor substrate; and a second semiconductor chip including a second semiconductor substrate, wherein the first semiconductor substrate has a first substrate main surface and a first substrate back surface facing opposite directions in a first direction, and includes a first region and a second region disposed on the first substrate main surface, wherein the first semiconductor chip includes: a first MOSFET of a first type structure formed to include the first region; and a control circuit formed to include the second region, wherein the second semiconductor chip includes a second MOSFET of a second type structure formed to include the second semiconductor substrate, and wherein the second type structure is different from the first type structure.

14 Claims, 8 Drawing Sheets

A1

SEMICONDUCTOR DEVICE

CROSS-REFERENCE TO RELATED APPLICATION

This application is based upon and claims the benefit of priority from Japanese Patent Application No. 2018-136498, filed on Jul. 20, 2018, the entire contents of which are incorporated herein by reference.

TECHNICAL FIELD

The present disclosure relates to a semiconductor device.

BACKGROUND

In the related art, a conventional semiconductor device is disclosed. The semiconductor device disclosed in the related art is a semiconductor device used for a power converter such as a power supply, and is particularly applied to a non-insulated DC/DC converter. The semiconductor device includes two MOSFETs (Metal-Oxide-Semiconductor Field-Effect Transistors), a driver IC for driving each MOSFET, and a sealing resin. In the conventional semiconductor device, the two MOSFETs are connected in series with one being used as a switching element on the high side and the other being used as a switching element on the low side. Then, the driver IC controls driving (switching between a conductive state and a cut-off state) of each MOSFET to convert an input voltage to desired output power. The semiconductor device disclosed in the related art has a device structure where the two MOSFETs and the driver IC are respectively configured as separate semiconductor chips, which are covered with the sealing resin. In this manner, a plurality of semiconductor chips having different functions are combined and packaged by one sealing resin to realize a high-level system.

However, since the semiconductor device disclosed in the related art is configured with three different semiconductor chips, the number of components thereof is increased. As a result, the size and cost of the semiconductor device may increase.

SUMMARY

Some embodiments of the present disclosure provide a semiconductor device capable of preventing an increase in size and cost.

According to an embodiment of the present disclosure, there is provided a semiconductor device, including: a first semiconductor chip including a first semiconductor substrate; and a second semiconductor chip including a second semiconductor substrate, wherein the first semiconductor substrate has a first substrate main surface and a first substrate back surface facing opposite directions in a first direction, and includes a first region and a second region disposed on the first substrate main surface, wherein the first semiconductor chip includes: a first MOSFET of a first type structure formed to include the first region; and a control circuit formed to include the second region, wherein the second semiconductor chip includes a second MOSFET of a second type structure formed to include the second semiconductor substrate, and wherein the second type structure is different from the first type structure.

In some embodiments, the first type structure is a horizontal type structure, and the second type structure is a vertical structure.

In some embodiments, the semiconductor device further include: an input terminal to which an input voltage is input; an output terminal from which an output voltage is output; and a ground terminal, wherein the first MOSFET and the second MOSFET are connected in series between the input terminal and the ground terminal, wherein a connection node between the first MOSFET and the second MOSFET is connected to the output terminal, and wherein the control circuit is connected to a gate electrode of the first MOSFET and a gate electrode of the second MOSFET.

In some embodiments, a source electrode of the first MOSFET is connected to a drain electrode of the second MOSFET, a drain electrode of the first MOSFET is connected to the input terminal, and a source electrode of the second MOSFET is connected to the ground terminal.

In some embodiments, a source electrode of the second MOSFET is connected to a drain electrode of the first MOSFET, a drain electrode of the second MOSFET is connected to the input terminal, and a source electrode of the first MOSFET is connected to the ground terminal.

In some embodiments, the control circuit controls the first MOSFET and the second MOSFET in a synchronous rectification manner, and a conduction time of the second MOSFET is longer than a conduction time of the first MOSFET.

In some embodiments, a drain region and a source region are formed on the first region of the first MOSFET, and a first drain electrode pad electrically connected to the drain region and a first source electrode pad electrically connected to the source region are disposed on the first substrate main surface.

In some embodiments, the control circuit has an active region formed on the second region, and an electrode pad electrically connected to the active region is disposed on the first substrate main surface.

In some embodiments, the first semiconductor substrate is made of a p-type semiconductor material.

In some embodiments, the first MOSFET is of an n-channel type.

In some embodiments, the second semiconductor chip has a second chip main surface facing the same direction as the first substrate main surface, and a second chip back surface facing the same direction as the first substrate back surface, a second source electrode pad of the second MOSFET is disposed on the second chip main surface, and a second drain electrode pad of the second MOSFET is disposed on the second chip back surface.

In some embodiments, the second semiconductor substrate is made of an n-type semiconductor material.

In some embodiments, the first semiconductor chip and the second semiconductor chip are aligned in a second direction perpendicular to the first direction when viewed in the first direction.

In some embodiments, the semiconductor device further includes: a lead frame including a first pad portion on which the first semiconductor chip is mounted, a second pad portion on which the second semiconductor chip is mounted, and a plurality of terminal portions, each of the plurality of terminal portions being electrically connected to one of the first semiconductor chip and the second semiconductor chip.

In some embodiments, the semiconductor device further includes: a sealing resin configured to cover a portion of the lead frame, the first semiconductor chip and the second semiconductor chip.

DETAILED DESCRIPTION

Preferred embodiments of a semiconductor device of the present disclosure will now be described with reference to the drawings.

First, the circuit configuration of a semiconductor device A1 according to a first embodiment of the present disclosure will be described.

Figure 1:
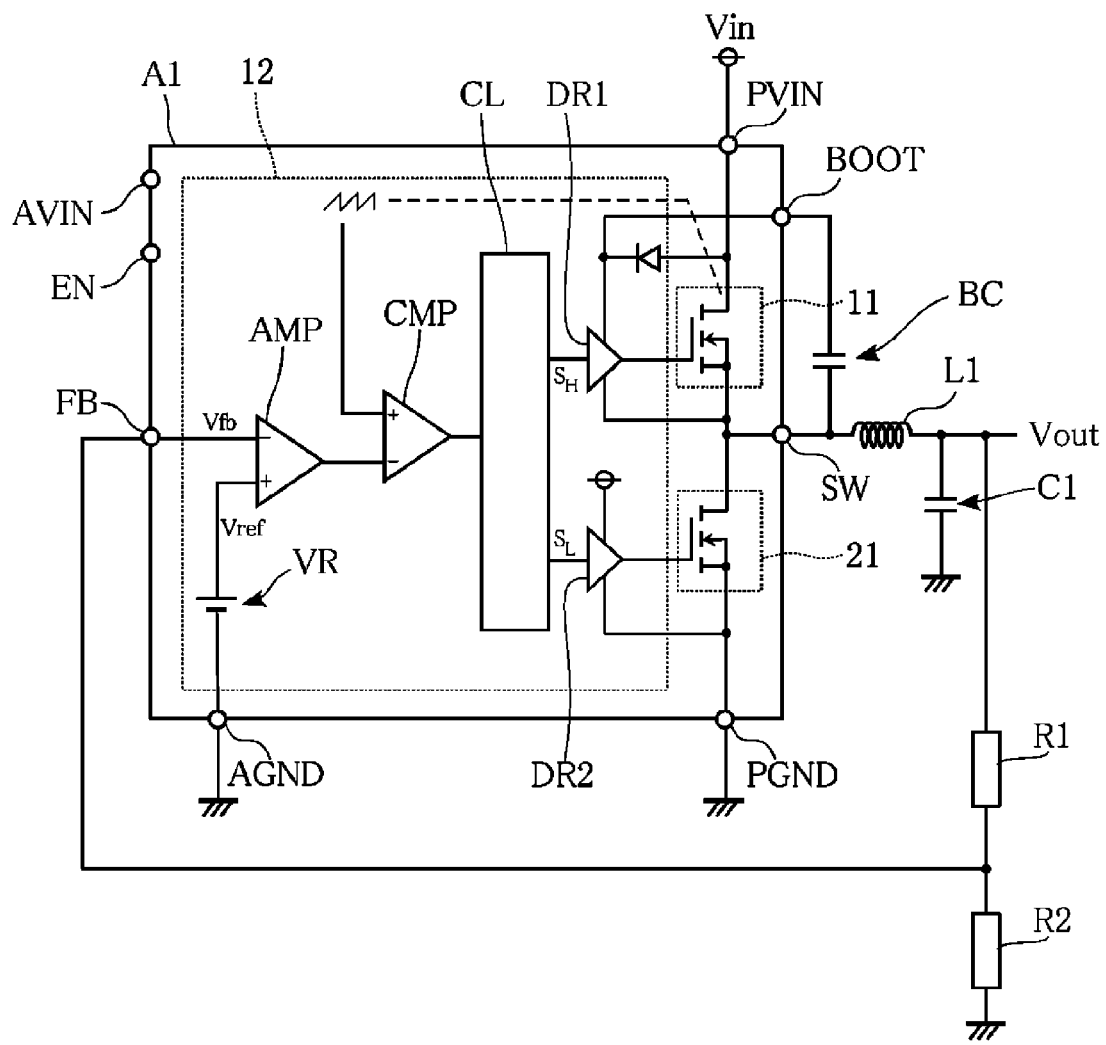
FIG. 1 is a circuit configuration diagram of a semiconductor device according to a first embodiment.

FIG. 1 shows a circuit configuration example of the semiconductor device A1 of the first embodiment. FIG. 1 shows an example in which the semiconductor device A1 is applied to a synchronous rectification type step-down DC/DC converter. As shown in FIG. 1, the step-down DC/DC converter includes the semiconductor device A1 and a plurality of discrete components externally attached to the semiconductor device A1. In the present embodiment, as shown in FIG. 1, a bootstrap capacitor BC, an inductor L1, a capacitor C1 and resistors R1 and R2 are included as the plurality of discrete components. FIG. 1 is just illustrative in a non-limiting manner.

The step-down DC/DC converter of this embodiment is a power supply that steps down an input voltage Vin to generate a desired output voltage Vout. In the present disclosure, the step-down ratio is a ratio at which the voltage can be lowered by the DC/DC converter, and is, for example, defined as a ratio of a difference between the input voltage Vin and the output voltage Vout to the input voltage Vin. A larger difference provides a larger step-down ratio. The step-down ratio in the present embodiment is not particularly limited, but can be appropriately designed from a relatively large one (for example, an output voltage Vout of 1.1V with respect to an input voltage Vin of 5V or an output voltage Vout of 3.3V with respect to an input voltage Vin of 12V) to a relatively small one (for example, an output voltage Vout of 3.3V with respect to an input voltage Vin of 5V).

As shown in FIG. 1, the semiconductor device A1 includes, as elements of its circuit configuration, a first MOSFET 11, a second MOSFET 21, a control circuit 12 and a plurality of external terminals. In this embodiment, the plurality of external terminals includes a power supply input terminal AVIN, a ground terminal AGND, a power supply input terminal PVIN, a ground terminal PGND, a switching output terminal SW, a boot terminal BOOT, a feedback terminal FB and an enable terminal EN. Note that the plurality of external terminals is just an example and is not limited to the one described above. In the present embodiment, the power supply input terminal PVIN and the ground terminal PGND correspond to an "input terminal" and a "ground terminal," respectively, as described in the claims.

The first MOSFET 11 and the second MOSFET 21 are switching elements that switch between a conductive state and a cut-off state based on a control signal from the control circuit 12. The first MOSFET 11 and the second MOSFET 21 are connected in series between the power supply input terminal PVIN and the ground terminal PGND. The power supply input terminal PVIN is a terminal for inputting the input voltage Vin to the semiconductor device A1, and is connected with a power supply that generates the input voltage Vin. In the present embodiment, the first MOSFET 11 is disposed on the high side, and the second MOSFET 21 is disposed on the low side. Specifically, a drain electrode of the first MOSFET 11 is connected to the power supply input terminal PVIN, a source electrode of the first MOSFET 11 is connected to a drain electrode of the second MOSFET 21, and a source electrode of the second MOSFET 21 is connected to the ground terminal PGND. A connection node between the first MOSFET 11 and the second MOSFET 21 is connected to the switching output terminal SW. The switching output terminal SW is an output terminal of the semiconductor device A1. The switching output terminal SW corresponds to an "output terminal" described in the claims. Further, each of the gate electrodes of the first MOSFET 11 and the second MOSFET 21 is respectively connected to the control circuit 12.

The control circuit 12 is an IC that controls driving of the first MOSFET 11 and the second MOSFET 21. Although a case where the control circuit 12 performs constant voltage output control is shown in the present embodiment, the present disclosure is not limited thereto but constant current output control may be performed or other control methods may be used. The control circuit 12 controls the driving of the first MOSFET 11 and the second MOSFET 21 by a synchronous rectification method. At this time, the control circuit 12 drives the first MOSFET 11 as a control switching element and the second MOSFET 21 as a synchronous rectification switching element. The control circuit 12 operates with a voltage input to the power supply input terminal AVIN and the ground terminal AGND. In this embodiment, as shown in FIG. 1, the control circuit 12 includes a reference voltage generation circuit VR, an error amplifier AMP, a comparison circuit CMP, a logic circuit CL, a high-side driver DR1 and a low-side driver DR2 in its circuit configuration.

The reference voltage generation circuit VR is a circuit that generates a reference voltage Vref in the semiconductor device A1. The reference voltage generation circuit VR outputs the generated reference voltage Vref to the error amplifier AMP. One end of the reference voltage generation circuit VR is connected to the error amplifier AMP and the other end thereof is connected to the ground terminal AGND.

The error amplifier AMP receives the reference voltage Vref and a feedback voltage Vfb and generates an error voltage Verr according to a difference between them. In the present embodiment, the error amplifier AMP is a so-called error amplifier. The error amplifier AMP has two input terminals (a non-inverting input terminal and an inverting input terminal) and one output terminal. The non-inverting input terminal of the error amplifier AMP is connected to the reference voltage generation circuit VR and receives the reference voltage Vref from the reference voltage generation circuit VR. The inverting input terminal of the error amplifier AMP is connected to the feedback terminal FB and receives the feedback voltage Vfb from the feedback terminal FB. The feedback terminal FB is a terminal for feeding back the output voltage Vout and receives the feedback voltage Vfb obtained by dividing the output voltage Vout of the DC/DC converter by the resistors R1 and R2. The output terminal of the error amplifier AMP is connected to the comparison circuit CMP and outputs the generated error voltage Verr.

The comparison circuit CMP receives a sense voltage Vcs and the error voltage Verr and compares them to generate a pulse width modulation signal $S_0$. The comparison circuit CMP is a so-called PWM comparator. The comparison circuit CMP has two input terminals (a non-inverting input terminal and an inverting input terminal) and one output terminal. The sense voltage Vcs corresponding to a source current of the first MOSFET 11 is input to the non-inverting input terminal of the comparison circuit CMP. The inverting input terminal of the comparison circuit CMP is connected to the error amplifier AMP and receives the error voltage Verr from the error amplifier AMP. The output terminal of the comparison circuit CMP is connected to the logic circuit CL and outputs the generated pulse width modulation signal $S_0$. The comparison circuit CMP may output a pulse frequency modulation signal instead of the pulse width modulation signal $S_0$. That is, the comparison circuit CMP can adopt a modulation method such as pulse width modulation or pulse frequency modulation.

The logic circuit CL generates a high-side control signal $S_H$ and a low-side control signal $S_L$ according to the pulse width modulation signal $S_0$ input from the comparison circuit CMP so as to obtain a desired output voltage Vout. The generated high-side control signal $S_H$ is input to the high-side driver DR1, and the generated low-side control signal $S_L$ is input to the low-side driver DR2.

The high-side driver DR1 amplifies the input high-side control signal $S_H$ to a level at which the first MOSFET 11 can be driven, and inputs the amplified high-side control signal $S_H$ to the gate electrode of the first MOSFET 11. The high-side driver DR1 turns on the first MOSFET 11 (conductive state) while the high-side control signal $S_H$ is an ON voltage, and turns off the first MOSFET 11 (cut-off state) while the high-side control signal $S_H$ is an OFF voltage. The positive power supply terminal of the high-side driver DR1 is connected to the BOOT terminal, and one end of the bootstrap capacitor BC is connected to the BOOT terminal. The other end of the bootstrap capacitor BC is connected to the switching output terminal SW. The negative power supply terminal of the high-side driver DR1 is connected to a connection node between the high-side driver DR1 and the low-side driver DR2.

The low-side driver DR2 amplifies the input low-side control signal $S_L$ to a level at which the second MOSFET 21 can be driven, and inputs the amplified low-side control signal $S_L$ to the gate electrode of the second MOSFET 21. The low-side driver DR2 turns on the second MOSFET 21 (conductive state) while the low-side control signal $S_L$ is an ON voltage, and turns off the second MOSFET 21 (cut-off state) while the low-side control signal $S_L$ is an OFF voltage. The input voltage Vin is input to the positive power supply terminal of the low-side driver DR2. The negative power supply terminal of the low-side driver DR2 is connected to the ground terminal PGND.

The control circuit 12 is configured as described above, and controls the driving of the first MOSFET 11 and the second MOSFET 21 so as to step down the input voltage Vin to the desired output voltage Vout by feedback control. The control circuit 12 is an example but is not limited to the one shown and may use a known technique for the configuration thereof. For example, the control circuit 12 may further include a protection circuit such as a load short-circuit protection circuit, an output overvoltage protection circuit or an overcurrent protection circuit.

The enable terminal EN is a control terminal of the device (semiconductor device A1). When the enable terminal EN is at a low level, the device is shut down. When the enable terminal EN is at a high level, the device is enabled.

Next, a device structure of the semiconductor device A1 according to the first embodiment of the present disclosure will be described.

FIGS. 2 to 6 show examples of the structure of the semiconductor device A1 of the first embodiment. As shown in FIGS. 2 to 6, the semiconductor device A1 of this embodiment includes, as elements of its device structure, a first semiconductor chip 1, a second semiconductor chip 2, a sealing resin 3, a lead frame 4 and a plurality of wires 5.

Figure 2:
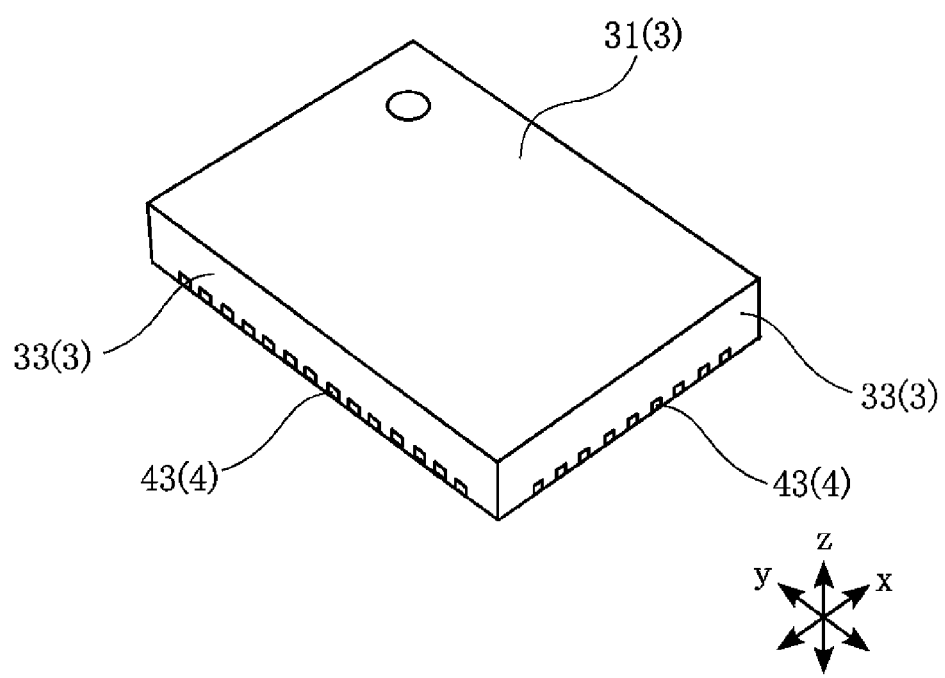
FIG. 2 is a perspective view of the semiconductor device according to the first embodiment.
Figure 3:
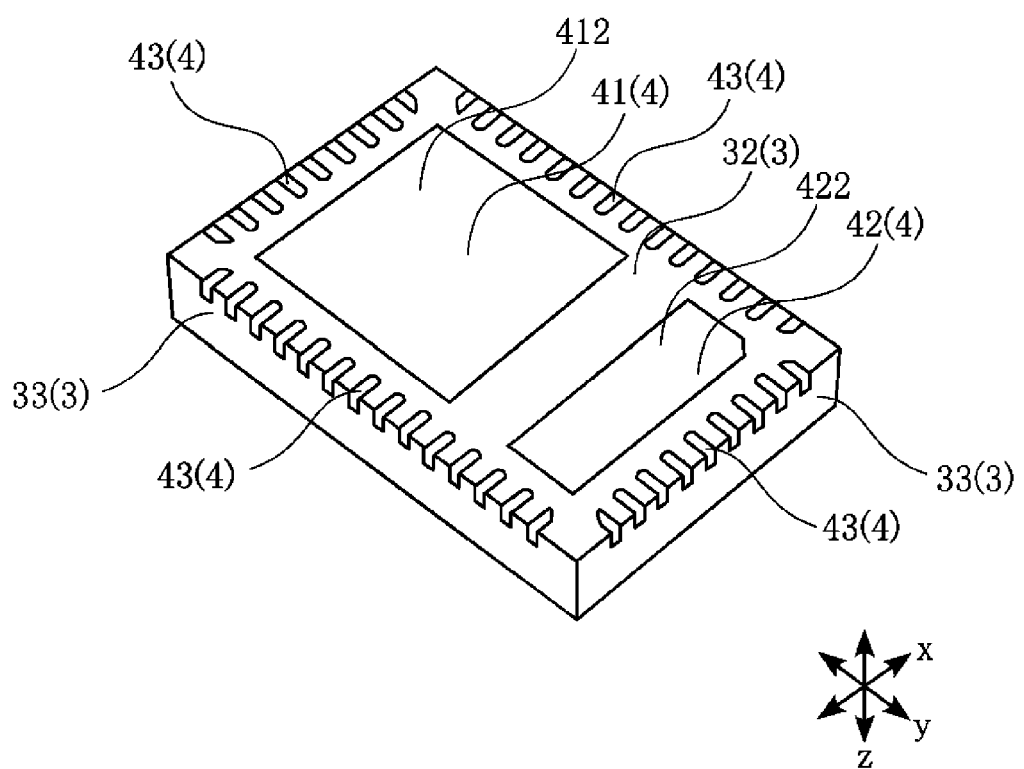
FIG. 3 is a perspective view of the semiconductor device according to the first embodiment.
Figure 4:
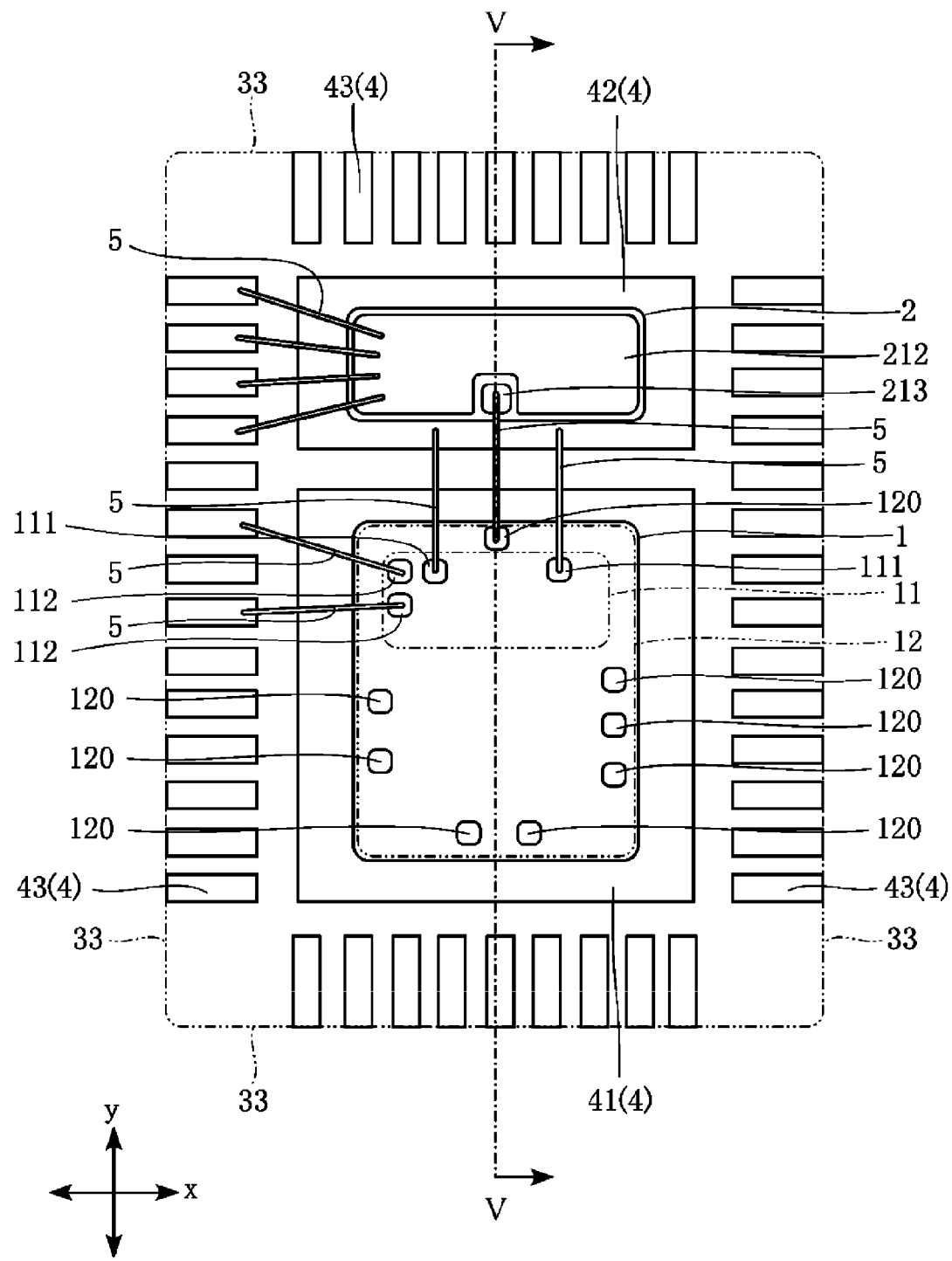
FIG. 4 is a plan view of the semiconductor device according to the first embodiment.
Figure 5:
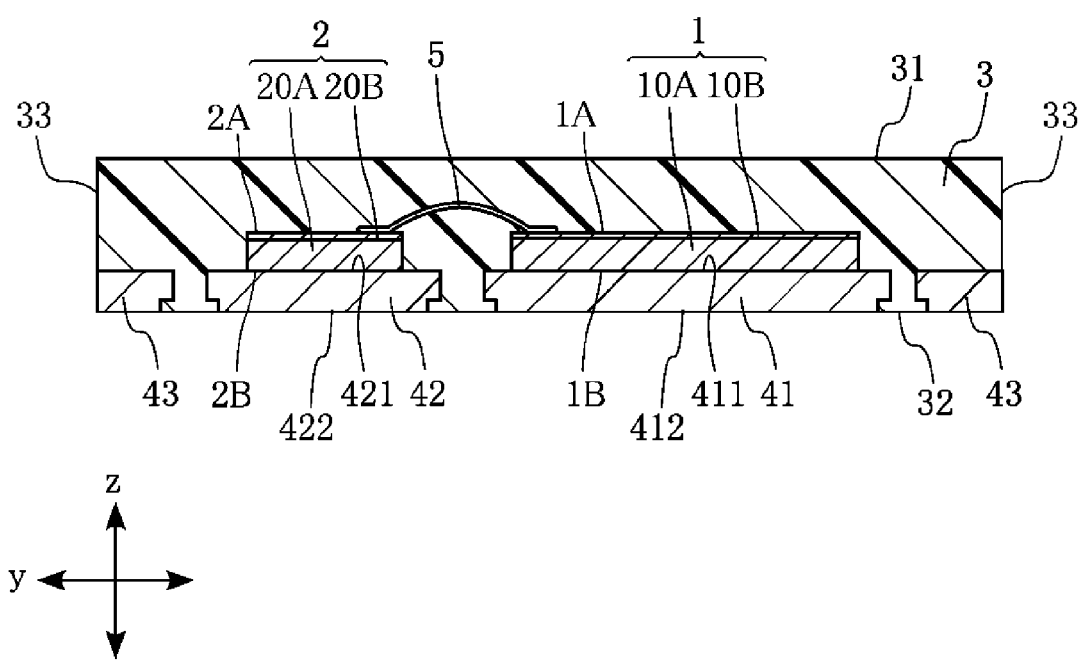
FIG. 5 is a sectional view of the semiconductor device according to the first embodiment.
Figure 6:
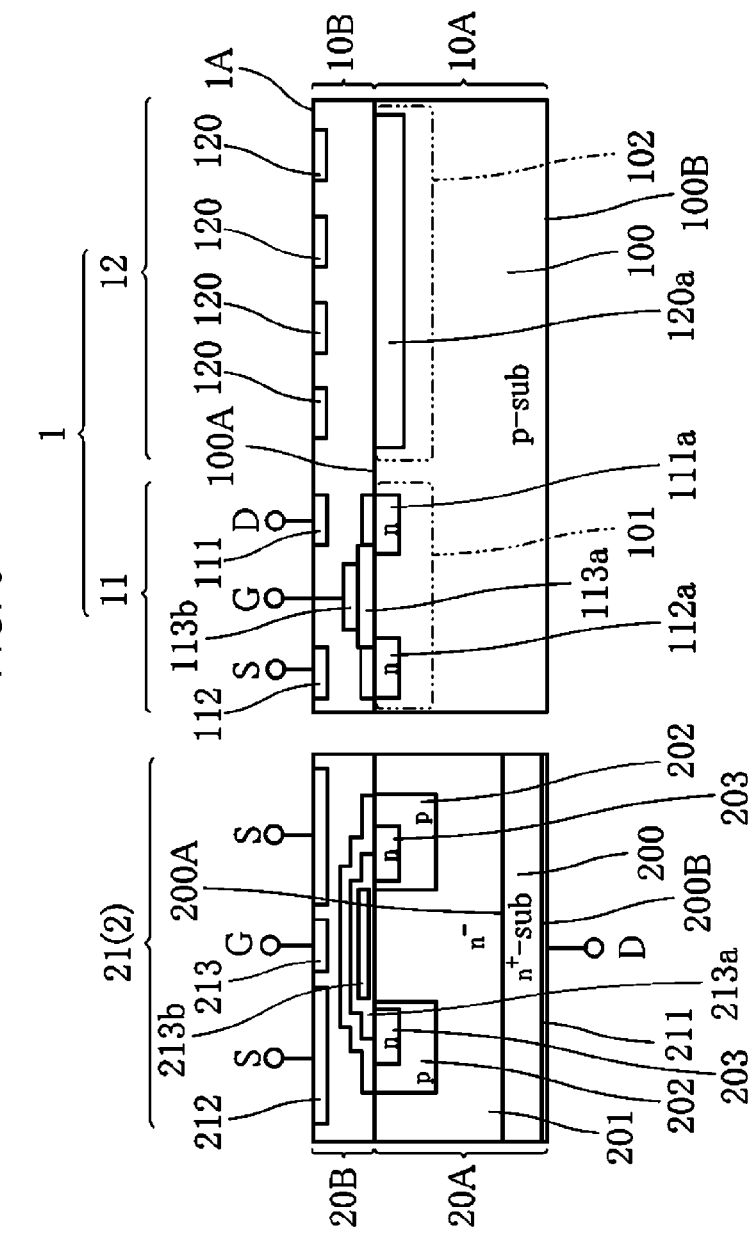
FIG. 6 is a schematic view showing sectional structures of a first semiconductor chip and a second semiconductor chip according to the first embodiment.

FIG. 2 is a perspective view of the semiconductor device A1. FIG. 3 is a perspective view of the semiconductor device A1. FIG. 4 is a plan view of the semiconductor device A1. In FIG. 4, the sealing resin 3 is shown with an imaginary line and some of the wires 5 are not shown. FIG. 5 is a sectional view taken along line V-V in FIG. 4. FIG. 6 is a schematic view showing sectional structures (without hatching) of the first semiconductor chip 1 and the second semiconductor chip 2. FIG. 6 is just schematic and does not correspond exactly to the other figures. For convenience of explanation, three directions orthogonal to each other in these figures are defined as an x direction, a y direction and a z direction, respectively. The x direction is the left-right direction in the plan view (see FIG. 4) of the semiconductor device A1. The y direction is the vertical direction in the plan view (see FIG. 4) of the semiconductor device A1. The z direction is the thickness direction of the semiconductor device A1. The y direction and the z direction correspond to a "second direction" and a "first direction" described in the claims.

The semiconductor device A1 is a resin package mounted on the surface of wiring boards of various electronic apparatuses. In the present embodiment, the semiconductor device A1 is a synchronous rectification type step-down DC/DC converter module. The semiconductor device A1 is of a two-chip-in-one package type in which the first semiconductor chip 1 and the second semiconductor chip 2 are covered with the sealing resin 3.

The first semiconductor chip 1, together with the second semiconductor chip 2, is to be a functional center of the semiconductor device A1. As shown in FIGS. 5 and 6, the first semiconductor chip 1 has a first chip main surface 1A and a first chip back surface 1B. The first chip main surface 1A and the first chip back surface 1B are separated from each other in the z direction and face opposite directions. In addition, as shown in FIGS. 5 and 6, the first semiconductor chip 1 includes a first semiconductor layer 10A and a first wiring layer 10B and has a structure where the first wiring layer 10B is stacked on the first semiconductor layer 10A.

The first semiconductor layer 10A is made of a semiconductor material. The semiconductor material in the present embodiment is, for example, Si (silicon). The semiconductor material is not limited to Si but may be GaAs (gallium arsenide) or SiC (silicon carbide). The first semiconductor layer 10A is configured to include a first semiconductor substrate 100. In the present embodiment, the first semiconductor substrate 100 is made of a p-type semiconductor material. As shown in FIG. 6, the first semiconductor substrate 100 has a first substrate main surface 100A and a first substrate back surface 100B. The first substrate main surface 100A and the first substrate back surface 100B are separated from each other in the z direction and face opposite directions. The first substrate main surface 100A faces in the same direction as the first chip main surface 1A, and the first substrate back surface 100B faces in the same direction as the first chip back surface 1B. As shown in FIG. 6, the first semiconductor substrate 100 includes a first region 101 and a second region 102 in a surface layer portion on the side of the first substrate main surface 100A. Further, as shown in FIG. 6, the first semiconductor layer 10A includes the first MOSFET 11 and the control circuit 12, which are formed on the first semiconductor substrate 100.

The first MOSFET 11 has a so-called horizontal structure. As shown in FIG. 6, the first MOSFET 11 is formed to include the first region 101 of the first semiconductor substrate 100. In the first MOSFET 11, a drain region 111a and a source region 112a are formed on the first region 101 of the first semiconductor substrate 100. The drain region 111a and the source region 112a are disposed on the side of the first substrate main surface 100A. In addition, the drain region 111a and the source region 112a are aligned along the first substrate main surface 100A and are separated from each other in the z direction. The drain region 111a and the source region 112a are both made of an n-type semiconductor material. An oxide layer 113a and a metal layer 113b are formed on a channel region sandwiched between the drain region 111a and the source region 112a. The metal layer 113b functions as the gate electrode of the first MOSFET 11. In the first MOSFET 11, electrons move from the source region 112a to the drain region 111a according to a voltage applied to the metal layer 113b (the gate electrode of the first MOSFET 11), whereby a current flows from the drain electrode to the source electrode. In the present embodiment, as shown in FIG. 6, the first MOSFET 11 is of a planar gate type. However, the present disclosure is not limited thereto, but the first MOSFET 11 may be of a trench gate type. Further, in the present embodiment, as shown in FIG. 6, the first MOSFET 11 is of an n-channel type. However, the present disclosure is not limited thereto, but the first MOSFET 11 may be of a p-channel type.

The control circuit 12 is formed to include the second region 102 of the first semiconductor substrate 100, as shown in FIG. 6. The above-mentioned elements of the circuit configuration of the control circuit 12 are formed in the corresponding active region 120a. That is, circuits for the reference voltage generation circuit VR, the error amplifier AMP, the comparison circuit CMP, the logic circuit CL, the high-side driver DR1 and the low-side driver DR2 are formed respectively in the active region 120a.

The first wiring layer 10B is stacked on the first semiconductor layer 10A. The first wiring layer 10B includes a plurality of conductive layers (not shown) separated from each other in the z direction. The number of conductive layers is not particularly limited. The first wiring layer 10B covers a plurality of conductive layers and has insulating films (not shown), each of which is formed so as to be interposed between the conductive layers. Further, in the first wiring layer 10B, a via (not shown) is formed so as to penetrate the insulating film sandwiched between the conductive layers. Although not particularly limited, a material of the via may be, for example, W (tungsten), Al (aluminum), Cu (copper) or the like. In the first wiring layer 10B, the conductive layers are electrically interconnected by the via. In the present embodiment, at least the gate electrode of the first MOSFET 11 and an electrode corresponding to the output terminal of the high-side driver DR1 of the control circuit 12 are interconnected by the first wiring layer 10B.

In the first wiring layer 10B, as shown in FIG. 6, a plurality of electrode pads is exposed from the surface layer (the first chip main surface 1A). In the present embodiment, a drain electrode pad 111 electrically connected to the drain region 111a of the first MOSFET 11, a source electrode pad 112 electrically connected to the source region 112a of the first MOSFET 11, and a plurality of electrode pads 120 electrically connected to the active region 120a of the control circuit 12 are exposed from the first chip main surface 1A. The drain electrode pad 111 and the source electrode pad 112 correspond to a "first drain electrode pad" and a "first source electrode pad" described in the claims.

The second semiconductor chip 2, together with the first semiconductor chip 1, is to be a functional center of the semiconductor device A1. As shown in FIGS. 5 and 6, the second semiconductor chip 2 has a second chip main surface 2A and a second chip back surface 2B. The second chip main surface 2A and the second chip back surface 2B are separated from each other in the z direction and face opposite directions. The second chip main surface 2A faces in the same direction as the first chip main surface 1A, and the second chip back surface 2B faces in the same direction as the first chip back surface 1B. The second chip back surface 2B is a mounting surface to the lead frame 4. In addition, the second semiconductor chip 2 includes a second semiconductor layer 20A and a second wiring layer 20B and has a structure where the second wiring layer 20B is stacked on the second semiconductor layer 20A.

The second semiconductor layer 20A is made of a semiconductor material. The semiconductor material in the present embodiment is, for example, Si. The semiconductor material is not limited to Si but may be GaAs or SiC. The second semiconductor layer 20A is configured to include a second semiconductor substrate 200, as shown in FIG. 6. In the present embodiment, the second semiconductor substrate 200 is made of an n-type semiconductor material. As shown in FIG. 6, the second semiconductor substrate 200 has a second substrate main surface 200A and a second substrate back surface 200B. The second substrate main surface 200A and the second substrate back surface 200B are separated from each other in the z direction and face opposite directions. The second substrate main surface 200A faces the same direction as the second chip main surface 2A, and the second substrate back surface 200B faces the same direction as the second chip back surface 2B. Further, the second semiconductor layer 20A includes the second MOSFET 21 formed on the second semiconductor substrate 200.

The second MOSFET 21 has a so-called vertical structure. As shown in FIG. 6, in the second MOSFET 21, an epitaxial layer 201 is formed on the second substrate main surface 200A of the second semiconductor substrate 200. The epitaxial layer 201 is made of an n-type semiconductor material. A well diffusion region 202 is formed in an upper layer portion of the epitaxial layer 201. The well diffusion region 202 is made of a p-type semiconductor material. Source regions 203 of the second MOSFET 21 are formed in the well diffusion region 202. The source region 203 is made of an n-type semiconductor material. An oxide layer 213a and a metal layer 213b are formed in a region sandwiched between the two source regions 203. The metal layer 213b functions as the gate electrode of the second MOSFET 21. Further, in the present embodiment, a drain electrode pad 211 is disposed on the second substrate back surface 200B of the second semiconductor substrate 200. Therefore, the drain electrode pad 211 is disposed on the second chip back surface 2B. In the second MOSFET 21, electrons move from the source region 203 on the side of the second chip main surface 2A to the second semiconductor substrate 200 on the side of the second chip back surface 2B according to a voltage applied to the metal layer 213b (the gate electrode of the second MOSFET 21), whereby a current flows from the drain electrode to the source electrode. The drain electrode pad 211 corresponds to a "second drain electrode pad" described in the claims. In the present embodiment, as shown in FIG. 6, the second MOSFET 21 is of a planar gate type. However, the present disclosure is not limited thereto, but the second MOSFET 21 may be of a trench gate type. Further, in the present embodiment, as shown in FIG. 6, the second MOSFET 21 is of an n-channel type. However, the present disclosure is not limited thereto, but the second MOSFET 21 may be of a p-channel type.

The second wiring layer 20B is stacked on the second semiconductor layer 20A. The second wiring layer 20B includes a plurality of conductive layers (not shown) separated from each other in the z direction. The number of conductive layers is not particularly limited. The second wiring layer 20B covers a plurality of conductive layers and has insulating films (not shown), each of which is formed so as to be interposed between the conductive layers. Further, in the second wiring layer 20B, a via (not shown) is formed so as to penetrate the insulating film sandwiched between the conductive layers. Although not particularly limited, the material of the via may be, for example, W, Al, Cu or the like.

In the second wiring layer 20B, as shown in FIG. 6, the source electrode pad 212 and the gate electrode pad 213 are exposed from the surface layer (the second chip main surface 2A). The source electrode pad 212 is electrically connected to the source region 203 of the second MOSFET 21. The gate electrode pad 213 is electrically connected to the metal layer 213b of the second MOSFET 21. The source electrode pad 212 corresponds to a "second source electrode pad" described in the claims.

The sealing resin 3 covers a portion of the lead frame 4, the first semiconductor chip 1 and the second semiconductor chip 2. The sealing resin 3 is, for example, a synthetic resin containing a black epoxy resin as a main ingredient. The sealing resin 3 has a resin main surface 31, a resin back surface 32 and a plurality of resin side surfaces 33.

The resin main surface 31 and the resin back surface 32 are separated from each other in the z direction, as shown in FIG. 5. The resin main surface 31 faces the same direction as the first chip main surface 1A and the second chip main surface 2A, and the resin back surface 32 faces the same direction as the first chip back surface 1B and the second chip back surface 2B. Each of the plurality of resin side surfaces 33 is sandwiched between the resin main surface 31 and the resin back surface 32. In the present embodiment, the sealing resin 3 has a pair of resin side surfaces 33 which are separated from each other in the x direction and face opposite directions, and a pair of resin side surfaces 33 which are separated from each other in the y direction and face opposite directions.

The first semiconductor chip 1 and the second semiconductor chip 2 are mounted on and electrically connected to the lead frame 4. The lead frame 4 is made of metal. In the present embodiment, the metal is, for example, Cu as a main component. The material of the lead frame 4 is not limited thereto but may be Ni (nickel), an alloy of Cu and Ni, an alloy 42 or the like. The lead frame 4 is formed into a predetermined shape by, for example, metal pressing (stamping) or the like. In the present embodiment, as shown in FIGS. 4 and 5, the lead frame 4 includes a first pad portion 41, a second pad portion 42 and a plurality of terminal portions 43. These portions are separated from one another.

The first semiconductor chip 1 is mounted on the first pad portion 41. The first pad portion 41 has a first pad main surface 411 and a first pad back surface 412, as shown in FIG. 5. The first pad main surface 411 and the first pad back surface 412 are separated from each other in the z direction and face opposite directions. The first pad main surface 411 faces the same direction as the first chip main surface 1A. The first semiconductor chip 1 is bonded to the first pad main surface 411 via a bonding material (not shown) or the like. The material of the bonding material is not particularly limited. The first pad back surface 412 faces the same direction as the first chip back surface 1B. The first pad back surface 412 is exposed from the resin back surface 32 and is flush with the resin back surface 32.

The second semiconductor chip 2 is mounted on the second pad portion 42. The second pad portion 42 has a second pad main surface 421 and a second pad back surface 422, as shown in FIG. 5. The second pad main surface 421 and the second pad back surface 422 are separated from each other in the z direction and face opposite directions. The second pad main surface 421 faces the same direction as the second chip main surface 2A. The second semiconductor chip 2 is bonded to the second pad main surface 421 via a conductive bonding material (not shown). The material of the conductive bonding material is not particularly limited. The second pad back surface 422 faces the same direction as the second chip back surface 2B. The second pad back surface 422 is exposed from the resin back surface 32 and is flush with the resin back surface 32. In the present embodiment, the drain electrode pad 211 of the second MOSFET 21 is disposed on the second chip back surface 2B of the second semiconductor chip 2, and the drain electrode pad 211 and the second pad portion 42 are electrically interconnected. Thus, the second pad portion 42 functions as the drain electrode of the second MOSFET 21.

As shown in FIG. 4, the plurality of terminal portions 43 is disposed so as to surround the first pad portion 41 and the second pad portion 42 as viewed in the z direction. The plurality of terminal portions 43 includes those which are electrically connected to either the first semiconductor chip 1 or the second semiconductor chip 2 and those which are not electrically connected to any of the first semiconductor chip 1 and the second semiconductor chip 2. All the terminal portions 43 may be electrically connected to either the first semiconductor chip 1 or the second semiconductor chip 2. In the present embodiment, as shown in FIGS. 2 to 4, the lead frame 4 includes, as the plurality of terminal portions 43, 14 terminal portions 43 exposed from respective resin side surfaces 33 facing the x direction, and 9 terminal portions 43 exposed from the respective resin side surfaces 33 facing they direction. The number of terminal portions 43 is not limited to the number described above. In addition, some of the plurality of terminal portions 43 may be connected inside the sealing resin 3.

In the lead frame 4, the first pad portion 41 and the second pad portion 42 are aligned in the y direction as shown in FIGS. 4 and 5. Therefore, the first semiconductor chip 1 mounted on the first pad portion 41 and the second semiconductor chip 2 mounted on the second pad portion 42 are aligned in the y direction.

The plurality of wires 5 connects the first semiconductor chip 1 or the second semiconductor chip 2 to the lead frame 4 or connects the first semiconductor chip 1 to the second semiconductor chip 2. The plurality of wires 5 is a linear member made of a conductive metal such as Au, Al, Cu or the like. The plurality of wires 5 is bonded by wire bonding. Although only some of the plurality of wires 5 are shown in FIG. 4 as described above, in reality, they may be added as appropriate depending on the arrangement of the terminal portions 43 of the lead frame 4 of the semiconductor device A1 and the arrangement of the electrode pads of the first semiconductor chip 1 and the second semiconductor chip 2.

Next, operational effects of the semiconductor device A1 will be described.

The semiconductor device A1 includes the first semiconductor chip 1 including the first MOSFET 11 and the control circuit 12, and the second semiconductor chip 2 including the second MOSFET 21. Then, in the semiconductor device A1, the sealing resin 3 covers the first semiconductor chip 1 and the second semiconductor chip 2. That is, since the first MOSFET 11 and the control circuit 12 are configured as one semiconductor chip (the first semiconductor chip 1), the number of semiconductor chips can be smaller than that when the first MOSFET 11, the second MOSFET 21 and the control circuit 12 are configured as different semiconductor chips (the semiconductor device in the related art). As a result, in the semiconductor device A1, the number of components may be smaller than that of the semiconductor device of the related art, thereby preventing an increase in size and cost.

Figure 7:
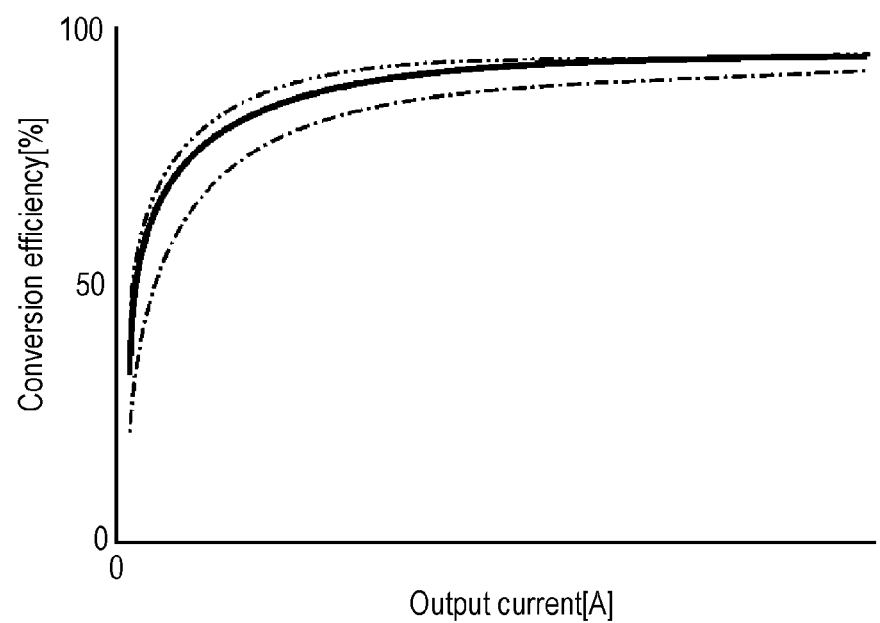
FIG. 7 is a view for explaining the effects of the semiconductor device according to the first embodiment.

In the semiconductor device A1, the first MOSFET 11 is formed in a horizontal structure, and the second MOSFET 21 is formed in a vertical structure. FIG. 7 shows a relationship between an output current (horizontal axis) and conversion efficiency (vertical axis) when the input voltage Vin is 12V and the output voltage Vout is 5V. In FIG. 7, a one-dot chain line indicates a case where both the first MOSFET 11 and the second MOSFET 21 are formed in a horizontal structure, a solid line indicates a case where the first MOSFET 11 is formed in a horizontal structure and the second MOSFET 21 is formed in a vertical structure as in the semiconductor device A1 of the present embodiment, and a two-dot chain line indicates a case where both the first MOSFET 11 and the second MOSFET 21 are formed in a vertical structure. Generally, a horizontal MOSFET has an on-resistance larger than that of a vertical MOSFET. Therefore, as shown in FIG. 7, conversion efficiency of the semiconductor device can be improved by forming both the first MOSFET 11 and the second MOSFET 21 in the vertical structure, as shown in FIG. 7. However, it is difficult to form the vertical MOSFET and the control circuit 12 in one semiconductor chip. On the other hand, by forming both the first MOSFET 11 and the second MOSFET 21 in the horizontal structure, it is possible to reduce the number of components and to prevent an increase in size and cost of the semiconductor device. However, in this case, as shown in FIG. 7, the conversion efficiency is reduced. Therefore, by forming the first MOSFET 11 in the horizontal structure and forming the second MOSFET 21 in the vertical scheme, it is possible to prevent a reduction in the conversion efficiency of the semiconductor device A1 and it can be relatively easy to form the first MOSFET 11 and the control circuit in one semiconductor chip (the first semiconductor chip 1).

In the semiconductor device A1, the first MOSFET 11 and the control circuit 12 are formed in the first semiconductor chip 1. Therefore, the control circuit 12 and the horizontal MOSFET (the first MOSFET 11) constitute one semiconductor chip (the first semiconductor chip 1). According to this configuration, the semiconductor chip can be manufactured more easily than in a case where the vertical MOSFET (the second MOSFET 21) and the control circuit 12 are formed in the same semiconductor chip.

In the semiconductor device A1, the second MOSFET 21 is a switching element on the low side in the circuit configuration, and has a vertical structure in the device structure. For example, in the DC/DC converter (see FIG. 1) using the semiconductor device A1, when a step-down ratio is large, a time for which the switching element on the low side (the second MOSFET 21) is in a conductive state is long. That is, a driving time of the second MOSFET 21 is longer than that of the first MOSFET 11. In addition, the vertical MOSFET has an on-resistance smaller than that of the horizontal MOSFET. From these facts, the semiconductor device A1 can reduce a power loss of the semiconductor device A1 in an application mode in which the step-down ratio is increased (when the conduction time of the low-side MOSFET is increased). That is, the conversion efficiency of the semiconductor device A1 can be improved.

In the semiconductor device A1, the first MOSFET 11 is a switching element on the high side in the circuit configuration, and has a horizontal structure in the device structure. According to this configuration, a parasitic capacitance of the first MOSFET 11 works well for noise suppression. That is, the noise of the semiconductor device A1 can be suppressed. Incidentally, the inventors of the present disclosure have found through testing that more noise can be suppressed when both the first MOSFET 11 and the second MOSFET 21 are formed in the horizontal structure than when both the first MOSFET 11 and the second MOSFET 21 are formed in the vertical structure. It has also been found that the noise can be suppressed when the first MOSFET 11 is formed in the horizontal structure and the second MOSFET 21 is formed in the vertical structure in the same manner as when both the first MOSFET 11 and the second MOSFET 21 are formed in the horizontal structure. Therefore, the semiconductor device A1 effectively realizes suppression of noise by using the first MOSFET 11 of the horizontal structure for the switching element on the high side.

In the semiconductor device A1, the first pad portion 41 of the lead frame 4 has the first semiconductor chip 1 mounted thereon, and the first pad back surface 412 is exposed from the sealing resin 3 (the resin back surface 32). According to this configuration, heat generated from the first semiconductor chip 1 at the time of electrical conduction of the semiconductor device A1 can be efficiently released through the first pad portion 41.

As shown in FIG. 1, the semiconductor device A1 is configured for a synchronous rectification type DC/DC converter in which the first MOSFET 11 and the second MOSFET 21 are connected in series. Therefore, the semiconductor device A1 can improve the conversion efficiency by suppressing the power loss, as compared with a case where the device is configured for an asynchronous rectification type DC/DC converter in which the first MOSFET 11 and a diode are connected in series.

Hereinafter, other embodiments of the semiconductor device of the present disclosure will be described. In the other embodiments to be described below, the elements identical or similar to those of the first embodiment are denoted by the same reference numerals as those of the first embodiment, and explanation thereof will not be repeated.

Figure 8:
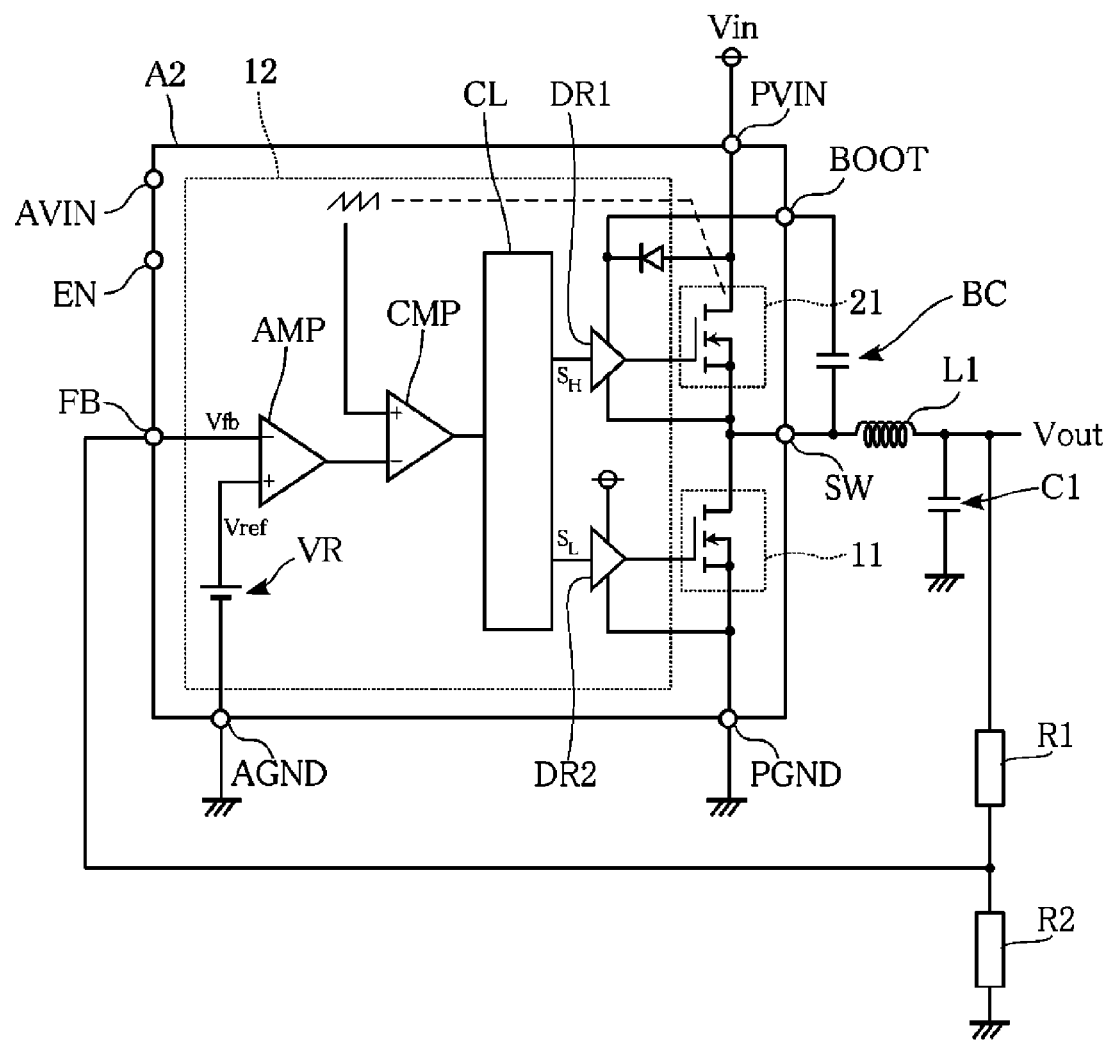
FIG. 8 is a circuit configuration diagram of a semiconductor device according to a second embodiment.

FIG. 8 shows a circuit configuration of a semiconductor device A2 according to a second embodiment of the present disclosure. FIG. 8 illustrates a synchronous rectification type step-down DC/DC converter using the semiconductor device A2. The circuit configuration shown in FIG. 8 differs from the circuit configuration shown in FIG. 1 in a connection relationship between the first MOSFET 11 and the second MOSFET 21.

In the semiconductor device A2, as shown in FIG. 8, the second MOSFET 21 is disposed on the high side, and the first MOSFET 11 is disposed on the low side. Specifically, a drain electrode of the second MOSFET 21 is connected to a power supply input terminal PVIN, a source electrode of the second MOSFET 21 is connected to a drain electrode of the first MOSFET 11, and a source electrode of the first MOSFET 11 is connected to a ground terminal PGND.

A device configuration of the semiconductor device A2 is substantially the same as that of the semiconductor device A1. However, a configuration of a first wiring layer 10B of the first semiconductor chip 1 and a second wiring layer 20B of the second semiconductor chip 2 and arrangement of a plurality of wires 5 may be changed as appropriate.

The semiconductor device A2 configured as described above also includes the first semiconductor chip 1 including the first MOSFET 11 and the control circuit 12, and the second semiconductor chip 2 including the second MOSFET 21. In the semiconductor device A2, a sealing resin 3 covers the first semiconductor chip 1 and the second semiconductor chip 2. As a result, in the semiconductor device A2, as in the semiconductor device A1 of the first embodiment, the number of components is smaller than that of the semiconductor device in the related art, thereby preventing an increase in size and cost.

In the semiconductor device A2, the second MOSFET 21 is a switching element on the high side in the circuit configuration, and has a vertical structure in the device structure. For example, in the DC/DC converter (see FIG. 8) using the semiconductor device A2, when the step-down ratio is small, the time for which the switching element on the high side (the second MOSFET 21) is in a conductive state is long. That is, the driving time of the second MOSFET 21 is longer than that of the first MOSFET 11. In addition, the vertical MOSFET has an on-resistance smaller than that of the horizontal MOSFET. From these facts, the semiconductor device A2 can reduce the power loss of the semiconductor device A2 in an application mode in which the step-down ratio is decreased (when the conduction time of the MOSFET on the high side is increased). That is, the conversion efficiency of the semiconductor device A2 can be improved.

In the first embodiment and the second embodiment, as shown in FIGS. 2 and 3, the semiconductor devices A1 and A2 are semiconductor packages called QFN (Quad Flat Non-leaded Package). However, the present disclosure is not limited thereto. For example, the semiconductor device of the present disclosure may be a semiconductor package called an SON package (Small Outline Non-leaded Package), a semiconductor package called an SOP (Small Outline Package), a semiconductor package called a QFP (Quad Flat Package) or the like.

The semiconductor device according to the present disclosure is not limited to the embodiments described above. The specific configuration of each part of the semiconductor device of the present disclosure can be varied in design in many ways.

According to the present disclosure in some embodiments, it is possible to provide a semiconductor device capable of preventing an increase in size and cost.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device, comprising:
   a first semiconductor chip including a first semiconductor substrate; and
   a second semiconductor chip including a second semiconductor substrate,
   wherein the first semiconductor substrate has a first substrate main surface and a first substrate back surface facing opposite directions in a first direction, and includes a first region and a second region disposed on the first substrate main surface,
   wherein the second semiconductor substrate has a second substrate main surface and a second substrate back surface facing opposite directions in the first direction,
   wherein the first semiconductor chip includes:
      a first MOSFET of a first type structure formed to include the first region; and
      a control circuit formed to include the second region,
   wherein the second semiconductor chip includes a second MOSFET of a second type structure formed to include the second semiconductor substrate,
   wherein the second type structure is different from the first type structure, and
   wherein a drain region and a source region of the first MOSFET are aligned along the first substrate main surface,
   wherein the first MOSFET is a high-side transistor having a horizontal structure by which a drain electrode and a source electrode are disposed over the first substrate main surface,
   wherein the first MOSFET and the control circuit are disposed over the first substrate main surface, and
   wherein the second MOSFET is a low-side transistor having a vertical structure by which a source electrode is disposed over the second substrate main surface and a drain electrode is disposed below the second substrate back surface.

2. The semiconductor device of claim 1, further comprising:
   an input terminal to which an input voltage is input;
   an output terminal from which an output voltage is output; and
   a ground terminal,
   wherein the first MOSFET and the second MOSFET are connected in series between the input terminal and the ground terminal,
   wherein a connection node between the first MOSFET and the second MOSFET is connected to the output terminal, and
   wherein the control circuit is connected to a gate electrode of the first MOSFET and a gate electrode of the second MOSFET.

3. The semiconductor device of claim 2,
   wherein the source electrode of the first MOSFET is connected to the drain electrode of the second MOSFET,
   wherein the drain electrode of the first MOSFET is connected to the input terminal, and
   wherein the source electrode of the second MOSFET is connected to the ground terminal.

4. The semiconductor device of claim 2,
   wherein the source electrode of the second MOSFET is connected to the drain electrode of the first MOSFET, wherein the drain electrode of the second MOSFET is connected to the input terminal, and wherein the source electrode of the first MOSFET is connected to the ground terminal.

5. The semiconductor device of claim 3, wherein the control circuit controls the first MOSFET and the second MOSFET in a synchronous rectification manner, and wherein a conduction time of the second MOSFET is longer than a conduction time of the first MOSFET.

6. The semiconductor device of claim 1, wherein the drain region and the source region are formed on the first region of the first MOSFET, and wherein a first drain electrode pad electrically connected to the drain region and a first source electrode pad electrically connected to the source region are disposed on the first substrate main surface.

7. The semiconductor device of claim 1, wherein the control circuit has an active region formed on the second region, and an electrode pad electrically connected to the active region is disposed on the first substrate main surface.

8. The semiconductor device of claim 1, wherein the first semiconductor substrate is made of a p-type semiconductor material.

9. The semiconductor device of claim 1, wherein the first MOSFET is of an n-channel type.

10. The semiconductor device of claim 1, wherein the second semiconductor chip has a second chip main surface facing the same direction as the first substrate main surface, and a second chip back surface facing the same direction as the first substrate back surface, wherein a second source electrode pad of the second MOSFET is disposed on the second chip main surface, and wherein a second drain electrode pad of the second MOSFET is disposed on the second chip back surface.

11. The semiconductor device of claim 1, wherein the second semiconductor substrate is made of an n-type semiconductor material.

12. The semiconductor device of claim 1, wherein the first semiconductor chip and the second semiconductor chip are aligned in a second direction perpendicular to the first direction when viewed in the first direction.

13. The semiconductor device of claim 1, further comprising:

a lead frame including a first pad portion on which the first semiconductor chip is mounted, a second pad portion on which the second semiconductor chip is mounted, and a plurality of terminal portions, each of the plurality of terminal portions being electrically connected to one of the first semiconductor chip and the second semiconductor chip.

14. The semiconductor device of claim 13, further comprising:

a sealing resin configured to cover a portion of the lead frame, the first semiconductor chip and the second semiconductor chip.

* * * * *